(12) United States Patent
Drego et al.

(10) Patent No.: US 10,997,115 B2
(45) Date of Patent: May 4, 2021

(54) SYSTEMS AND METHODS FOR IMPLEMENTING A MACHINE PERCEPTION AND DENSE ALGORITHM INTEGRATED CIRCUIT AND ENABLING A FLOWING PROPAGATION OF DATA WITHIN THE INTEGRATED CIRCUIT

(71) Applicant: quadric.io, Inc., San Carlos, CA (US)

(72) Inventors: Nigel Drego, San Carlos, CA (US); Aman Sikka, San Carlos, CA (US); Ananth Durbha, San Carlos, CA (US); Mrinalini Ravichandran, San Carlos, CA (US); Robert Daniel Firu, San Carlos, CA (US); Veerbhan Kheterpal, San Carlos, CA (US)

(73) Assignee: quadric.io, Inc., Burlingame, CA (US)

( * ) Notice: Subject to any disclaimer, the term of this patent is extended or adjusted under 35 U.S.C. 154(b) by 151 days.

(21) Appl. No.: 16/292,537

(22) Filed: Mar. 5, 2019

(65) Prior Publication Data
US 2019/0303518 A1    Oct. 3, 2019

Related U.S. Application Data

(60) Provisional application No. 62/649,551, filed on Mar. 28, 2018.

(51) Int. Cl.
*G06F 15/80* (2006.01)
*G06F 9/50* (2006.01)
*G06F 30/39* (2020.01)

(52) U.S. Cl.
CPC ........ *G06F 15/8046* (2013.01); *G06F 9/5061* (2013.01); *G06F 30/39* (2020.01)

(58) Field of Classification Search
None
See application file for complete search history.

(56) References Cited

U.S. PATENT DOCUMENTS 5,465,368 A   11/1995   Davidson et al.
5,522,085 A    5/1996   Harrison et al.
(Continued)

OTHER PUBLICATIONS

"International Search Report and Written Opinion of the ISA, dated Jun. 3, 2019, for application No. PCT/US19/20266."
(Continued)

*Primary Examiner* — William B Partridge
(74) *Attorney, Agent, or Firm* — Alce PLLC; Padowithz Alce

(57) ABSTRACT

Systems and methods of propagating data within an integrated circuit includes: identifying a coarse data propagation path for distinct subsets of data of an input dataset that includes: setting inter-core data movements for the distinct subsets of data, the inter-core data movements defining a predetermined propagation of a given subset of data between two or more of a plurality of cores of an integrated circuit array of the integrated circuit; identifying a granular data propagation path for each distinct subset of data that includes: setting intra-core data movements for each distinct subset of data, the intra-core data movements defining a predetermined propagation of the given subset of data within one or more of the plurality of cores of the integrated circuit array of the integrated circuit; enabling a flow of the input dataset within the integrated circuit based on the coarse data propagation path and the granular propagation path.

20 Claims, 7 Drawing Sheets

(56) References Cited

U.S. PATENT DOCUMENTS

| | | | |
|---|---|---|---|
| 5,708,835 | A | 1/1998 | Burnett |
| 6,130,551 | A | 10/2000 | Agrawal et al. |
| 6,476,636 | B1 | 11/2002 | Lien et al. |
| 6,800,884 | B1 | 10/2004 | Feng et al. |
| 6,867,615 | B1 | 3/2005 | Plants et al. |
| 7,099,983 | B2 | 8/2006 | Emerson et al. |
| 7,111,155 | B1 | 9/2006 | Anderson et al. |
| 7,577,820 | B1 | 8/2009 | Wentzlaff et al. |
| 8,572,353 | B1 | 10/2013 | Bratt et al. |
| 8,677,081 | B1 | 3/2014 | Wentzlaff et al. |
| 9,043,769 | B2 | 5/2015 | Vorbach |
| 9,213,652 | B1 | 12/2015 | Miao et al. |
| 9,432,298 | B1 | 8/2016 | Smith |
| 9,600,416 | B2 | 3/2017 | Ramanujan et al. |
| 10,282,808 | B2 | 5/2019 | Seiler et al. |
| 2005/0093571 | A1 | 5/2005 | Suaris et al. |
| 2007/0050603 | A1 | 3/2007 | Vorbach et al. |
| 2007/0226463 | A1 | 9/2007 | Chaudhry et al. |
| 2008/0010170 | A1* | 1/2008 | Chan .................... G06Q 10/087 705/28 |
| 2009/0024836 | A1 | 1/2009 | Shen et al. |
| 2010/0180100 | A1 | 7/2010 | Lu et al. |
| 2012/0089812 | A1 | 4/2012 | Smith |
| 2012/0110303 | A1 | 5/2012 | Dhanwada et al. |
| 2012/0216012 | A1 | 8/2012 | Vorbach et al. |
| 2013/0024826 | A1 | 1/2013 | Master |
| 2014/0173228 | A1 | 6/2014 | Lee et al. |
| 2015/0127877 | A1 | 5/2015 | Novellini et al. |
| 2015/0242635 | A1* | 8/2015 | Li ......................... G06F 21/577 726/25 |
| 2017/0293451 | A1 | 10/2017 | Pan et al. |
| 2017/0345122 | A1 | 11/2017 | Seiler et al. |
| 2018/0032335 | A1 | 2/2018 | Smith et al. |

OTHER PUBLICATIONS

"International Search Report and Written Opinion of the ISA, dated May 23, 2019, for application No. PCT/US19/20652."

* cited by examiner

SYSTEMS AND METHODS FOR IMPLEMENTING A MACHINE PERCEPTION AND DENSE ALGORITHM INTEGRATED CIRCUIT AND ENABLING A FLOWING PROPAGATION OF DATA WITHIN THE INTEGRATED CIRCUIT

CROSS-REFERENCE TO RELATED APPLICATIONS

This application claims the benefit of U.S. Provisional Application No. 62/649,551, filed 28 Mar. 2018, which is incorporated in its entirety by this reference.

TECHNICAL FIELD

The one or more inventions described herein relate generally to the integrated circuitry field, and more specifically to a new and useful dense algorithm processing integrated circuitry architecture in the integrated circuitry field.

BACKGROUND

Modern applications of artificial intelligence and generally, machine learning appear to be driving innovations in robotics and specifically, in technologies involving autonomous robotics and autonomous vehicles. Also, the developments in machine perception technology have enabled the abilities of many of the implementations in the autonomous robotics' and autonomous vehicles' spaces to perceive vision, perceive hearing, and perceive touch among many other capabilities that allow machines to comprehend their environments.

The underlying perception technologies applied to these autonomous implementations include a number of advanced and capable sensors that often allow for a rich capture of environments surrounding the autonomous robots and/or autonomous vehicles. However, while many of these advanced and capable sensors may enable a robust capture of the physical environments of many autonomous implementations, the underlying processing circuitry that may function to process the various sensor signal data from the sensors often lack in corresponding robust processing capabilities sufficient to allow for high performance and real-time computing of the sensor signal data.

The underlying processing circuitry often include general purpose integrated circuits including central processing units (CPUs) and graphic processing units (GPU). In many applications, GPUs are implemented rather than CPUs because GPUs are capable of executing bulky or large amounts of computations relative to CPUs. However, the architectures of most GPUs are not optimized for handling many of the complex machine learning algorithms (e.g., neural network algorithms, etc.) used in machine perception technology. For instance, the autonomous vehicle space includes multiple perception processing needs that extend beyond merely recognizing vehicles and persons. Autonomous vehicles have been implemented with advanced sensor suites that provide a fusion of sensor data that enable route or path planning for autonomous vehicles. But, modern GPUs are not constructed for handling these additional high computation tasks.

At best, to enable a GPU or similar processing circuitry to handle additional sensor processing needs including path planning, sensor fusion, and the like, additional and/or disparate circuitry may be assembled to a traditional GPU. This fragmented and piecemeal approach to handling the additional perception processing needs of robotics and autonomous machines results in a number of inefficiencies in performing computations including inefficiencies in sensor signal processing.

Accordingly, there is a need in the integrated circuitry field for an advanced integrated circuit that is capable of high performance and real-time processing and computing of routine and advanced sensor signals for enabling perception of robotics or any type or kind of perceptual machine.

The inventors of the inventions described in the present application have designed an integrated circuit architecture that allows for enhanced sensor data processing capabilities and have further discovered related methods for implementing the integrated circuit architecture for several purposes including for enabling perception of robotics and various machines.

SUMMARY OF THE INVENTIONS

In one embodiment, a method of controlling a movement of data within an integrated circuit includes: obtaining an input dataset; identifying a coarse data propagation path for each of a plurality of distinct subsets of data of the input dataset, wherein identifying the coarse data propagation path includes: setting inter-core data movements for each of the plurality of distinct subsets of data, the inter-core data movements defining a predetermined propagation of a given subset of data of the plurality of distinct subsets of data between two or more of a plurality of cores of an integrated circuit array of the integrated circuit; identifying a granular data propagation path for each of the plurality of distinct subsets of data of the input dataset, wherein identifying the granular data propagation path includes: setting intra-core data movements for each of the plurality of distinct subsets of data, the intra-core data movements defining a predetermined propagation of the given subset of data of the plurality of distinct subsets of data within one or more of the plurality of cores of the integrated circuit array of the integrated circuit; enabling a flow of the input dataset within the integrated circuit based on the coarse data propagation path and the granular propagation path.

In one embodiment, each of the coarse data propagation path and the granular data propagation path are defined based on a predetermined data flow schedule that governs a propagation of data between a hierarchical memory structure of the integrated circuit and the integrated circuit array of the integrated circuit.

In one embodiment, the integrated circuit array includes: a plurality of array cores, wherein each of the plurality of array cores comprises at least one processing circuit for processing input data; a plurality of border cores, wherein each of the plurality of border cores comprises at least one register file for storing input data; and the plurality of array cores are distinct from the plurality of border cores.

In one embodiment, the hierarchical memory structure enables direct memory access between a main memory and the integrated circuit array, the hierarchical memory structure includes: a plurality of dual FIFOs that each interface with the integrated circuit array and transmits and accepts data on a first-in, first-out basis, a plurality of periphery load stores that each interface with a respective dual FIFO of the plurality of dual FIFOs and store one or more loads of data that is either received from the respective dual FIFO and/or that is pending a loading into the respective dual FIFO, and a plurality of periphery memory that each interface with a respective periphery load store of the plurality of periphery load stores and interfaces with the main memory.

In one embodiment, the method includes generating data movement instructions based on attributes of the input dataset and an architecture of the integrated circuit array, wherein the data movement instructions define the coarse data propagation path and the granular data propagation path for each of the plurality of distinct data subsets of the input dataset.

In one embodiment, the method includes generating data computation instructions and/or execution instructions; and generating a single set of instructions that includes a combination of data movement instructions together with one or more of data computation instructions and execution instructions.

In one embodiment, generating data movement instructions includes: identifying, from the input dataset, each of the plurality of distinct subsets of data based on a predefined configuration of the integrated circuit array, wherein identifying each of the plurality of distinct subsets of data includes: partitioning the input dataset into the plurality of distinct subsets of data to fit the predefined configuration of the integrated circuit array.

In one embodiment, the method includes:
associating, with each of the plurality of distinct subsets of data of the input dataset, a given coarse data propagation path; and associating, with each of the plurality of distinct subsets of data of the input dataset, a given granular data propagation path.

In one embodiment, the coarse data propagation path for each of the plurality of distinct subsets of data defines at least a starting position of each of the plurality of distinct subsets of data and a terminal position of each of the plurality of distinct subsets of data.

In one embodiment, the granular data propagation path for each of the plurality of distinct subsets of data defines intermediary travel positions that occur between the starting position and the terminal position.

In one embodiment, the granular propagation path for each of the plurality of distinct subsets of data includes a sequence of data movements comprising one or more data rotation instructions that, when executed, causes a given subset of data of the plurality of distinct subsets of data to move in a rotational manner from a first data port of a core of the plurality of cores to one or more disparate data ports of the core.

In one embodiment, the one or more data rotation instructions include one or more discrete rotation values defined as a specific degree of rotation value defined as a degree of rotation between zero degrees and three hundred sixty degrees and/or between zero degrees and negative three hundred sixty degrees measured from an initial position of the given subset of data within the core.

In one embodiment, each data movement of a sequence of data movements for a given subset of data requires only a single clock cycle to execute.

In one embodiment, the coarse data propagation path and the granular data propagation path for each of the plurality of distinct subsets of data are performed without issuing memory address by the plurality of cores.

In one embodiment, a method of propagating data within an integrated circuit includes: obtaining an input dataset; implementing a coarse data propagation path for each of a plurality of distinct subsets of data of the input dataset, wherein the coarse data propagation path includes: defined inter-core data movements for each of the plurality of distinct subsets of data, the inter-core data movements defining a predetermined travel path of a given subset of data of the plurality of distinct subsets of data through two or more of a plurality of cores of an integrated circuit array of the integrated circuit; implementing a granular data propagation path for each of the plurality of distinct subsets of data of the input dataset, wherein the granular data propagation path includes: defined intra-core data movements for each of the plurality of distinct subsets of data, the intra-core data movements defining a predetermined travel path of the given subset of data of the plurality of distinct subsets of data within one or more of the plurality of cores of the integrated circuit array of the integrated circuit; executing a flow of the input dataset within the integrated circuit based on the coarse data propagation path and the granular propagation path.

In one embodiment, each of the coarse data propagation path and the granular data propagation path are defined based on a predetermined data flow schedule that governs a propagation of data between a hierarchical memory structure of the integrated circuit and the data processing circuits of the integrated circuit.

In one embodiment, the integrated circuit array includes: a plurality of array cores, wherein each of the plurality of array cores comprises at least one processing circuit for processing input data; a plurality of border cores, wherein each of the plurality of border cores comprises at least one register file for storing input data; and the plurality of array cores are distinct from the plurality of border cores.

In one embodiment, the hierarchical memory structure enables direct memory access between a main memory and the integrated circuit array, the hierarchical memory structure includes: a plurality of dual FIFOs that each interface with the integrated circuit array and transmits and accepts data on a first-in, first-out basis, a plurality of periphery load stores that each interface with a respective dual FIFO of the plurality of dual FIFOs and store one or more loads of data that is either received from the respective dual FIFO and/or that is pending a loading into the respective dual FIFO, and a plurality of periphery memory that each interface with a respective periphery load store of the plurality of periphery load stores and interfaces with the main memory.

In one embodiment, a method of propagating data within an integrated circuit includes: identifying an input dataset; executing a coarse data propagation path for each of a plurality of distinct subsets of data of the input dataset, wherein the coarse data propagation path includes: defined inter-core data movements for each of the plurality of distinct subsets of data, the inter-core data movements defining a predetermined travel path of a given subset of data of the plurality of distinct subsets of data through two or more of a plurality of cores of an integrated circuit array of the integrated circuit; executing a granular data propagation path for each of the plurality of distinct subsets of data of the input dataset, wherein the granular data propagation path includes: defined intra-core data movements for each of the plurality of distinct subsets of data, the intra-core data movements defining a predetermined travel path of the given subset of data of the plurality of distinct subsets of data within one or more of the plurality of cores of the integrated circuit array of the integrated circuit.

In one embodiment, the integrated circuit array includes: a plurality of array cores, wherein each of the plurality of array cores comprises at least one processing circuit for processing input data; a plurality of border cores, wherein each of the plurality of border cores comprises at least one register file for storing input data; and the plurality of array cores are distinct from the plurality of border cores.

DESCRIPTION OF THE PREFERRED EMBODIMENTS

The following description of preferred embodiments of the present application are not intended to limit the inventions to these preferred embodiments, but rather to enable any person skilled in the art of to make and use these inventions.

I. Overview

As discussed above in the background section, the state of the art in integrated circuit architecture lacks a suitable solution for handling the multitude of perception processing tasks of robotics and autonomous machines. While GPUs may be modified with additional and/or disparate circuitry to perform some of these perception processing requirements of robotics and autonomous machines, significant gaps in a GPU's processing capabilities exist such that the resulting performance is low and not in real-time. Other perception processing circuits may exist including neural network-specific processors, computer-vision-specific processors, and the like; however, none of these provide a single comprehensive integrated circuit that is capable of processing the many disparate perception algorithms and computations needed for sensor acquisition, sensor fusion, perception processing, path planning, and the like.

Accordingly, one or more embodiments of the present application function to provide a comprehensive optimized compute platform for processing perception algorithms, perception data (e.g., sensor data and the like), and various perception processing requirements of robotics and autonomous machines. In preferred embodiments, the optimized compute platform may be implemented as a high performance and real-time processing dense algorithm processing unit (DAPU) and/or perception processing unit (PPU). In one or more implementations, the integrated circuit disclosed in the various embodiments of the present application includes an array core having a plurality of disparate processing elements and data flow and storage elements that operate to form a mesh architecture enabling the movement of data among and between many combinations of processing elements within the array core.

The mesh architecture defined by the plurality of processing elements in the array core preferably enable in-memory computing and mitigate communication and data processing latencies.

II. A System Architecture of a Dense Algorithm and/or Perception Processing Circuit (Unit)

Figure 1:
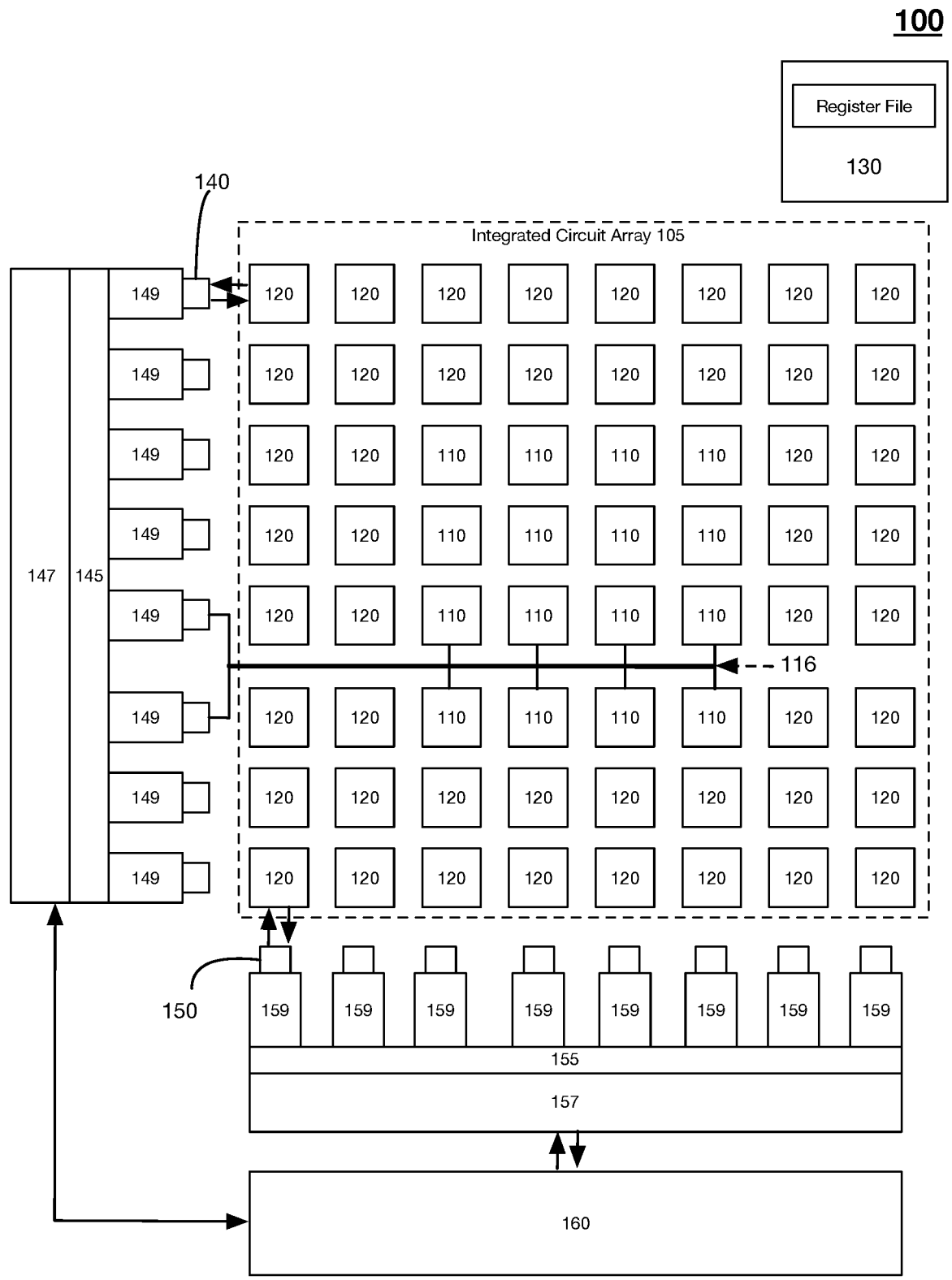
FIG. 1 illustrates a schematic of a system 100 in accordance with one or more embodiments of the present application.
Figure 1A:
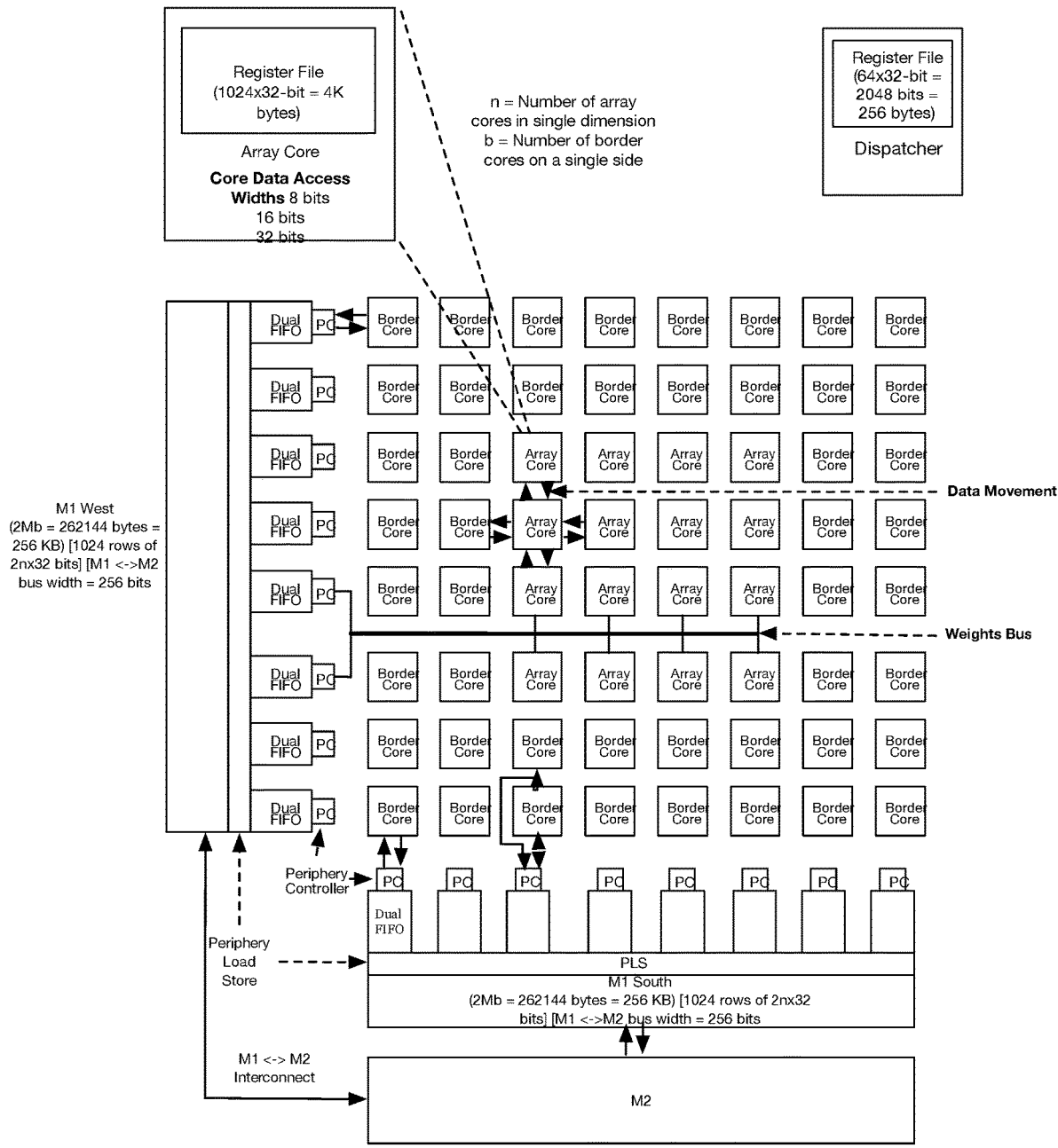
FIG. 1A illustrates an annotated schematic of a system 100 in accordance with one or more embodiments of the present application.

As shown in FIGS. 1-1A, the integrated circuit 100 (dense algorithm and/or perception processing unit) for performing perception processing includes a plurality of array cores 110, a plurality of border cores 120, a dispatcher (main controller) 130, a first plurality of periphery controllers 140, a second plurality of periphery controllers 150, and main memory 160. The integrated circuit 100 may additionally include a first periphery load store 145, a second periphery load store 155, a first periphery memory 147, a second periphery memory 157, a first plurality of dual FIFOs 149, and a second plurality of dual FIFOs 159.

The integrated circuit 100 preferably functions to enable real-time and high computing efficiency of perception data and/or sensor data. A general configuration of the integrated circuit 100 includes a plurality of array core 110 defining central signal and data processing nodes each having large register files that may eliminate or significantly reduce clock cycles needed by an array core 110 for pulling and pushing data for processing from memory, as described in U.S. Provisional Application No. 62/640,478 and in U.S. patent application Ser. No. 16/290,064, which are incorporated in their entireties by this reference. The instructions (i.e., computation/execution and data movement instructions) generating capabilities of the integrated circuit 100 (e.g., via the dispatcher 130 and/or a compiler module 175) functions to enable a continuity and flow of data throughout the integrated circuit 100 and namely, within the plurality of array cores 110 and border cores 120.

An array core 110 preferably functions as a data or signal processing node (e.g., a small microprocessor) or processing circuit and preferably, includes a register file 112 having a large data storage capacity (e.g., 1024 kb, etc.) and an arithmetic logic unit (ALU) 118 or any suitable digital electronic circuit that performs arithmetic and bitwise operations on integer binary numbers. In a preferred embodiment, the register file 112 of an array core 110 may be the only memory element that the processing circuits of an array core 110 may have direct access to. An array core 110 may have indirect access to memory outside of the array core and/or the integrated circuit array 105 (i.e., core mesh) defined by the plurality of border cores 120 and the plurality of array cores 110.

The register file 112 of an array core 110 may be any suitable memory element or device, but preferably comprises one or more static random-access memories (SRAMs). The register file 112 may include a large number of registers, such as 1024 registers, that enables the storage of a sufficiently large data set for processing by the array core 110. Accordingly, a technical benefit achieved by an arrangement of the large register file 112 within each array core 110 is that the large register file 112 reduces a need by an array core 110 to fetch and load data into its register file 112 for processing. As a result, a number of clock cycles required by the array core 112 to push data into and pull data out of memory is significantly reduced or eliminated altogether. That is, the large register file 112 increases the efficiencies of computations performed by an array core 110 because most, if not all, of the data that the array core 110 is scheduled to process is located immediately next to the processing circuitry (e.g., one or more MACs, ALU, etc.) of the array core 110. For instance, when implementing image processing by the integrated circuit 100 or related system using a neural network algorithm(s) or application(s) (e.g., convolutional neural network algorithms or the like), the large register file 112 of an array core may function to enable a storage of all the image data required for processing an entire image. Accordingly, most or if not, all layer data of a neural network implementation (or similar compute-intensive application) may be stored locally in the large register file 112 of an array core 110 with the exception of weights or coefficients of the neural network algorithm(s), in some embodiments. Accordingly, this allows for optimal utilization of the computing and/or processing elements (e.g., the one or more MACs and ALU) of an array core 110 by enabling an array core 110 to constantly churn data of the register file 112 and further, limiting the fetching and loading of data from an off-array core data source (e.g., main memory, periphery memory, etc.).

By comparison, to traverse a register file in a traditional system implemented by a GPU or the like, it is typically required that memory addresses be issued for fetching data from memory. However, in a preferred embodiment that implements the large register file 112, the (raw) input data within the register file 112 may be automatically incremented from the register file 112 and data from neighboring core(s) (e.g., array cores and/or border cores) are continuously sourced to the register file 112 to enable a continuous flow to the computing elements of the array core 110 without an express need to make a request (or issuing memory addresses) by the array core 110.

While in some embodiments of the present application, a predetermined data flow scheduled may mitigate or altogether, eliminate requests for data by components within the integrated circuit array 105, in a variant of these embodiments traditional random memory access may be achieved by components of the integrated circuit array 105. That is, if an array core 110 or a border core 120 recognizes a need for a random piece of data for processing, the array core 110 and/or the border 120 may make a specific request for data from any of the memory elements within the memory hierarchy of the integrated circuit 100.

Figure 2:
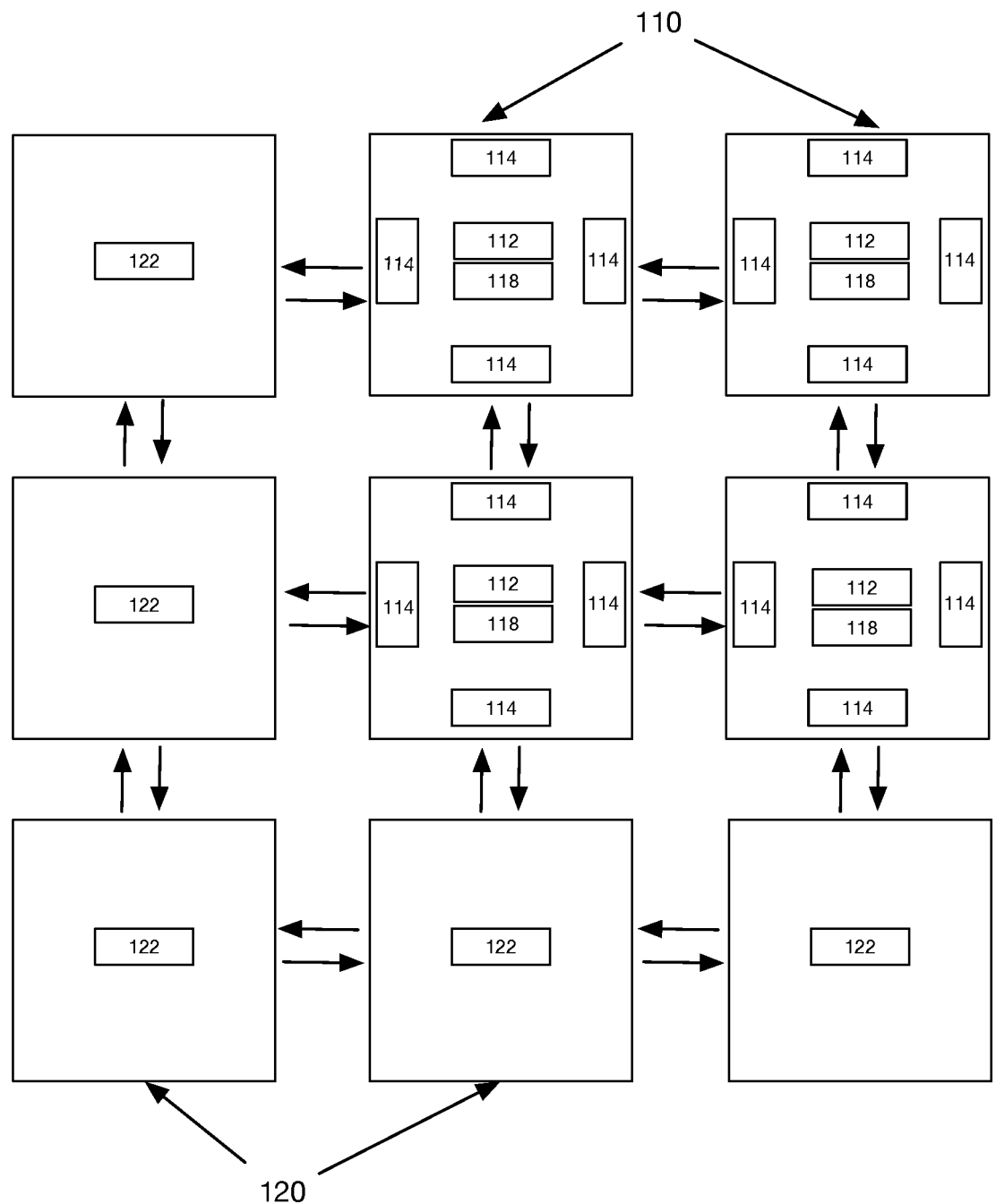
FIG. 2 illustrates a detailed schematic of a segment of the integrated circuit array 105 in accordance with one or more embodiments of the present application.

An array core 110 may, additionally or alternatively, include a plurality of multiplier (multiply) accumulators (MACs) 114 or any suitable logic devices or digital circuits that may be capable of performing multiply and summation functions. In a preferred embodiment, each array core 110 includes four (4) MACs and each MAC 114 may be arranged at or near a specific side of a rectangular shaped array core 110, as shown by way of example in FIG. 2. While, in a preferred embodiment each of the plurality of MACs 114 of an array core 110 may be arranged near or at the respective sides of the array core 110, it shall be known that the plurality of MACs 114 may be arranged within (or possibly augmented to a periphery of an array core) the array core 110 in any suitable arrangement, pattern, position, and the like including at the respective corners of an array core 110. In a preferred embodiment, the arrangement of the plurality of MACs 114 along the sides of an array core 110 enables efficient inflow or capture of input data received from one or more of the direct neighboring cores (i.e., an adjacent neighboring core) and the computation thereof by the array core 110 of the integrated circuit 100.

Accordingly, each of the plurality of MACs 114 positioned within an array core 110 may function to have direct communication capabilities with neighboring cores (e.g., array cores, border cores, etc.) within the integrated circuit 100. The plurality of MACs 114 may additionally function to execute computations using data (e.g., operands) sourced from the large register file 112 of an array core 110. However, the plurality of MACs 114 preferably function to source data for executing computations from one or more of their respective neighboring core(s) and/or a weights or coefficients (constants) bus 116 that functions to transfer coefficient or weight inputs of one or more algorithms (including machine learning algorithms) from one or more memory elements (e.g., main memory 160 or the like) or one or more input sources.

The weights bus 116 may be operably placed in electrical communication with at least one or more of periphery controllers 140, 150 at a first input terminal and additionally, operably connected with one or more of the plurality of array core 110. In this way, the weight bus 116 may function to collect weights and coefficients data input from the one or more periphery controllers 140, 150 and transmit the weights and coefficients data input directly to one or more of the plurality of array cores 110. Accordingly, in some embodiments, multiple array cores no may be fed weights and/or coefficients data input via the weights bus 116 in parallel to thereby improve the speed of computation of the array cores 110.

Each array core 110 preferably functions to bi-directionally communicate with its direct neighbors. That is, in some embodiments, a respective array core 110 may be configured as a processing node having a rectangular shape and arranged such that each side of the processing node may be capable of interacting with another node (e.g., another processing node, a data storage/movement node, etc.) that is positioned next to one of the four sides or each of the faces of the array core 110. The ability of an array core 110 to bi-directionally communicate with a neighboring core along each of its sides enables the array core 110 to pull in data from any of its neighbors as well as push (processed or raw) data to any of its neighbors. This enables a mesh communication architecture that allows for efficient movement of data throughout the collection of array and border cores 110, 120 of the integrated circuit 100.

Each of the plurality of border cores 120 preferably includes a register file 122. The register file 122 may be configured similar to the register file 112 of an array core 110 in that the register file 122 may function to store large datasets. Preferably, each border core 120 includes a simplified architecture when compared to an array core 110. Accordingly, a border core 120 in some embodiments may not include execution capabilities and therefore, may not include multiplier-accumulators and/or an arithmetic logic unit as provided in many of the array cores 110.

In a traditional integrated circuit (e.g., a GPU or the like), when input image data (or any other suitable sensor data) received for processing compute-intensive application (e.g., neural network algorithm) within such a circuit, it may be necessary to issue padding requests to areas within the circuit which do not include image values (e.g., pixel values) based on the input image data. That is, during image processing or the like, the traditional integrated circuit may function to perform image processing from a memory element that does not contain any image data value. In such instances, the traditional integrated circuit may function to request that a padding value, such as zero, be added to the memory element to avoid subsequent image processing efforts at the memory element without an image data value. A consequence of this typical image data processing by the traditional integrated circuit results in a number of clock cycles spent identifying the blank memory element and adding a computable value to the memory element for image processing or the like by the traditional integrated circuit.

In a preferred implementation of the integrated circuit 100, one or more of the plurality of border cores 120 may function to automatically set to a default value when no input data (e.g., input sensor data) is received. For instance, input image data from a sensor (or another circuit layer) may have a total image data size that does not occupy all border core cells of the integrated circuit array 105. In such instance, upon receipt of the input image data, the one or more border cores 120 (i.e., border core cells) without input image data may be automatically set to a default value, such as zero or a non-zero constant value.

In some embodiments, the predetermined input data flow schedule generated by the dispatcher and sent to one or more of the plurality of border cores may include instructions to set to a default or a predetermined constant value. Additionally, or alternatively, the one or more border cores 120 may be automatically set to a default or a predetermined value when it is detected that no input sensor data or the like is received with a predetermined input data flow to the integrated circuit array 105. Additionally, or alternatively, in one variation, the one or more border cores 120 may be automatically set to reflect values of one or more other border cores having input sensor data when it is detected that no input sensor data or the like is received with a predetermined input data flow to the integrated circuit array 105.

Accordingly, a technical benefit achieved according to the implementation of one or more of the plurality of border cores 120 as automatic padding elements, may include increasing efficiencies in computation by one or more of the plurality of array cores 110 by minimizing work requests to regions of interest (or surrounding areas) of input sensor data where automatic padding values have been set. Thereby, reducing clock cycles used by the plurality of array core 110 in performing computations on an input dataset.

In a preferred implementation of the integrated circuit 100, the progression of data into the plurality of array cores 110 and the plurality of border cores 120 for processing is preferably based on a predetermined data flow schedule generated at the dispatcher 130. The predetermined data flow schedule enables input data from one or more sources (e.g., sensors, other NN layers, an upstream device, etc.) to be loaded into the border cores 120 and array cores 110 without requiring an explicit request for the input data from the border cores 120 and/or array cores 110. That is, the predetermined data flow schedule enables an automatic flow of raw data from memory elements (e.g., main memory 160) of the integrated circuit 100 to the plurality of border cores 120 and the plurality of array cores 110 having capacity to accept data for processing. For instance, in the case that an array core 110 functions to process a first subset of data of a data load stored in its register file 112, once the results of the processing of the first subset of data is completed and sent out from the array core 110, the predetermined data flow schedule may function to enable an automatic flow of raw data into the array core 110 that adds to the data load at the register file 112 and replaces the first subset of data that was previously processed by the array core 110. Accordingly, in such instance, no explicit request for additional raw data for processing is required from the array core 110. Rather, the integrated circuit 100 implementing the dispatcher 130 may function to recognize that once the array core 110 has processed some amount of data sourced from its register file 112 (or elsewhere) that the array core 110 may have additional capacity to accept additional data for processing.

Figure 3A:
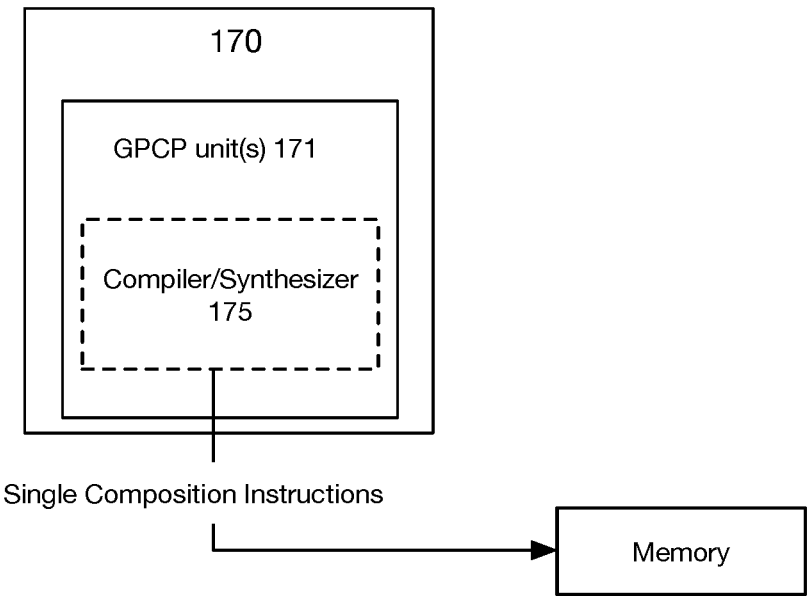
FIG. 3A illustrates a schematic of an instructions generator in accordance with one or more embodiments of the present application.

In a preferred embodiment, the integrated circuit 100 may be in operable communication with an instructions generator 170 that functions to generate computation, execution, and data movement instructions, as shown by way of example in FIG. 3A. The instructions generator 170 may be arranged off-chip relative to the components and circuitry of the integrated 100. However, in alternative embodiments, the instructions generator 170 may be cooperatively integrated within the integrated circuit 100 as a distinct or integrated component of the dispatcher 130.

Preferably, the instructions generator 170 may be implemented using one or more general purpose computers (e.g., a Mac computer, Linux computer, or any suitable hardware computer) or general purpose computer processing (GPCP) units 171 that function to operate a compiler module 175 that is specifically configured to generate multiple and/or disparate types of instructions. The compiler module 175 may be implemented using any suitable compiler software (e.g., a GNU Compiler Collection (GCC), a Clang compiler, and/or any suitable open source compiler or other compiler). The compiler module 175 may function to generate at least computation instructions and execution instructions as well as data movement instructions. In a preferred embodiment, at compile time, the compiler module 175 may be executed by the one or more GPCP units 171 to generate the two or more sets of instructions computation/execution instructions and data movement instructions sequentially or in parallel. In some embodiments, the compiler module 175 may function to synthesize multiple sets of disparate instructions into a single composition instruction set that may be loaded into memory (e.g., instructions buffer, an external DDR, SPI flash memory, or the like) from which the dispatcher may fetch the single composition instruction set from and execute.

In a first variation, however, once the compiler module 175 generates the multiple disparate sets of instructions, such as computation instructions and data movement instructions, the instructions generator 170 may function to load the instructions sets into a memory (e.g., memory 160 or off-chip memory associated with the generator 170). In such embodiments, the dispatcher 130 may function to fetch the multiple sets of disparate instructions generated by the instructions generator 170 from memory and synthesize the multiple sets of disparate instructions into a single composition instruction set that the dispatcher may execute and/or load within the integrated circuit 100.

In a second variation, the dispatcher 130 may be configured with compiling functionality to generate the single composition instruction set. In such variation, the dispatcher 130 may include processing circuitry (e.g., microprocessor or the like) that function to create instructions that include scheduled computations or executions to be performed by various circuits and/or components (e.g., array core computations) of the integrated circuit 100 and further, create instructions that enable a control a flow of input data through the integrated circuit 100. In some embodiments, the dispatcher 130 may function to execute part of the instructions and load another part of the instructions into the integrated circuit array 105. In general, the dispatcher 130 may function as a primary controller of the integrated circuit 100 that controls and manages access to a flow (movement) of data from memory to the one or more other storage and/or processing circuits of the integrated circuit 100 (and vice versa). Additionally, the dispatcher 130 may schedule control execution operations of the various sub-controllers (e.g., periphery controllers, etc.) and the plurality of array cores 110.

Figure 3B:
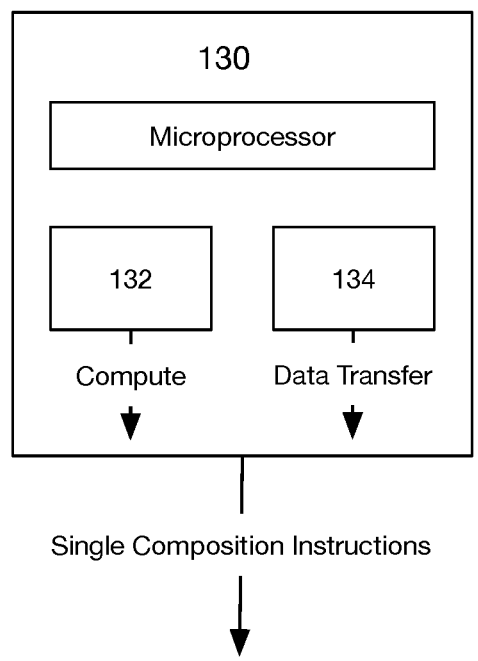
FIG. 3B illustrates a schematic of an integrated circuit controller in accordance with one or more embodiments of the present application.

As shown by way of example in FIG. 3B, in some embodiments, the processing circuitry of the dispatcher 130 includes disparate circuitry including a compute instruction generator circuit 132 and a data movement instructions generator circuit 134 (e.g., address generation unit or address computation unit) that may independently generate computation/execution instructions and data transfers/movements schedules or instructions, respectively. Accordingly, this configuration enables the dispatcher 130 to perform data address calculation and generation of computation/execution instructions in parallel. The dispatcher 130 may function to synthesize the output from both the computer instructions generator circuit 132 and the data movement instructions generator circuit 134 into a single instructions composition that combines the disparate outputs.

The single instructions composition generated by the instructions generator 170 and/or the dispatcher 130 may be provided to the one or more downstream components and integrated circuit array 105 and allow for computation or processing instructions and data transfer/movement instructions to be performed simultaneously by these various circuits or components of the integrated circuit 100. With respect to the integrated circuit array 105, the data movement component of the single instructions composition may be performed by one or more of periphery controllers 140, 150 and compute instructions by one or more of the plurality of array cores 110. Accordingly, in such embodiment, the periphery controllers 140, 150 may function to decode the data movement component of the instructions and if involved, may perform operations to read from or write to the dual FIFOs 149,159 and move that data from the dual FIFOs 149,159 onto a data bus to the integrated circuit (or vice versa). It shall be understood that the read or write operations performed by periphery controllers 140, 150 may performed sequentially or simultaneously (i.e., writing to and reading from dual FIFOs at the same time).

It shall be noted that while the compute instructions generator circuit 132 and the data movement instructions generator circuit 134 are preferably separate or independent circuits, in some embodiments the compute instructions generator circuit 132 and the data movement instructions generator circuit 134 may be implemented by a single circuit or a single module that functions to perform both compute instructions generation and data movement instruction generation.

In operation, the dispatcher 130 may function to generate and schedule memory addresses to be loaded into one or more the periphery load store 145 and the periphery load store 155. The periphery load stores 145,155 preferably include specialized execution units that function to execute all load and store instructions from the dispatcher 130 and may generally function to load or fetch data from memory or storing the data back to memory from the integrated array core. The first periphery load store 145 preferably communicably and operably interfaces with both the first plurality of dual FIFOs 149 and the first periphery memory 147. The first and the second periphery memory 147, 157 preferably comprise on-chip static random-access memory.

In configuration, the first periphery load store 145 may be arranged between the first plurality of dual FIFOs 149 and the first periphery memory 147 such that the first periphery load store 145 is positioned immediately next to or behind the first plurality of dual FIFOs 149. Similarly, the second periphery load store 155 preferably communicably and operably interfaces with both the second plurality of dual FIFOs 159 and the second periphery memory 157. Accordingly, the second periphery load store 155 may be arranged between the second plurality of dual FIFOs 159 and the second periphery memory 157 such that the second periphery load store 155 is positioned immediately next to or behind the second plurality of dual FIFOs 159.

In response to memory addressing instructions issued by the dispatcher 130 to one or more of the first and the second periphery load stores 145, 155, the first and the second periphery load stores 145, 155 may function to execute the instructions to fetch data from one of the first periphery memory 147 and the second periphery memory 157 and move the fetched data into one or more of the first and second plurality of dual FIFOs 149, 159. Additionally, or alternatively, the dual FIFOs 149, 159 may function to read data from a data bus and move the read data to one or more of the respective dual FIFOs or read data from one or more of the dual FIFOs and move the read data to a data bus. Similarly, memory addressing instructions may cause one or more of the first and the second periphery load stores 145, 155 to move data collected from one or more of the plurality of dual FIFOs 149, 159 into one of the first and second periphery memory 147, 157.

Each of the first plurality of dual FIFOs 149 and each of the second plurality of dual FIFOs 159 preferably comprises at least two memory elements (not shown). Preferably, the first plurality of dual FIFOs 149 may be arranged along a first side of the integrated circuit array 105 with each of the first plurality of dual FIFOs 149 being aligned with a row of the integrated circuit array 105. Similarly, the second plurality of dual FIFOs 159 may be arranged along a second side of the integrated circuit array 105 with each of the second plurality of dual FIFOs 159 being aligned with a column of the integrated circuit array 105. This arrangement preferably enables each border 120 along the first side of the integrated circuit array 105 to communicably and operably interface with at least one of the first periphery controllers 145 and each border 120 along the second side of the integrated circuit array 105 to communicably and operably interface with at least one of the second periphery controllers 155.

While it is illustrated in at least FIGS. 1-1A that there are a first and second plurality of dual FIFOs, first and second periphery controllers, first and second periphery memories, and first and second load stores, it shall be noted that these structures may be arranged to surround an entire periphery of the integrated circuit array 105 such that, for instance, these components are arranged along all (four) sides of the integrated circuit array 105.

The dual FIFOs 149, 159 preferably function to react to specific instructions for data from their respective side. That is, the dual FIFOs 149, 159 may be configured to identify data movement instructions from the dispatcher 130 that is specific to either the first plurality of dual FIFOs 149 along the first side or the second plurality of dual FIFOs along the second side of the integrated circuit array 105.

According to a first implementation, each of the dual FIFOs may use first of the two memory elements to push data into the integrated circuit array 105 and second of the two memory elements to pull data from the integrated circuit array 105. Thus, each dual FIFO 149, 159 may have a first memory element dedicated for moving data inward into the integrated circuit array 105 and a second memory element dedicated for moving data outward from the integrated circuit array 105.

According to a second implementation, the dual FIFOs may be operated in a stack (second) mode in which each respective dual FIFO functions to provide data into the integrated circuit array 105 in a predetermined sequence or order and collect the data from the integrated circuit array 105 in the same predetermined sequence or order.

Additionally, the integrated circuit 100 preferably includes main memory 160 comprising a single unified memory. The main memory 160 preferably functions to store data originating from one or more sensors, system-derived or generated data, data from one or more integrated circuit layers, data from one or more upstream devices or components, and the like. Preferably, the main memory 160 comprises on-chip static random-access memory or the like.

Additionally, or alternatively, main memory 160 may include multiple levels of on-die (on-chip) memory. In such embodiments, the main memory 160 may include multiple memory (e.g., SRAM) elements that may be in electrical communication with each other and function as a single unified memory that is arranged on a same die as the integrated circuit array 105.

Additionally, or alternatively, main memory 160 may include multiple levels of off-die (off-chip) memory (not shown). In such embodiments, the main memory 160 may include multiple memory (e.g., DDR SRAM, high bandwidth memory (HBM), etc.) elements that may be in electrical communication with each other and function as a single unified memory that is arranged on a separate die than the integrated circuit array.

It shall be noted that in some embodiments, the integrated circuit 100 includes main memory 160 comprising memory arranged on-die and off-die. In such embodiments, the on-die and the off-die memory of the main memory 160 may function as a single unified memory accessible to the on-die components of the integrated circuit 100.

Each of the first periphery memory 147 and the second periphery memory 157 may port into the main memory 160. Between the first periphery memory 147 and the main memory 160 may be arranged a load store unit that enables the first periphery memory 147 to fetch data from the main memory 160. Similarly, between the second periphery memory 157 and the main memory 160 may be arranged a second load store unit that enables the second periphery memory 157 to fetch data from the main memory 160.

It shall be noted that the data transfers along the memory hierarchy of the integrated circuit 100 occurring between dual FIFOs 149, 159 and the load stores 145, 155, between the load stores 145, 155 and the periphery memory 147, 157, and the periphery memory 147, 157 and the main memory 160 may preferably be implemented as prescheduled or predetermined direct memory access (DMA) transfers that enable the memory elements and load stores to independently access and transfer data within the memory hierarchy without direct invention of the dispatcher 130 or some main processing circuit. Additionally, the data transfers within the memory hierarchy of the integrated circuit 100 may be implemented as 2D DMA transfers having two counts and two strides thereby allowing for efficient data access and data reshaping during transfers. In a preferred embodiment, the DMA data transfers may be triggered by a status or operation of one or more of the plurality of array cores 110. For instance, if an array core is completing or has completed a processing of first set of data, the completion or near-completion may trigger the DMA transfers to enable additional data to enter the integrated circuit array 105 for processing.

III. Method(s) for Data Control within an Integrated Circuit Array

Figure 4:
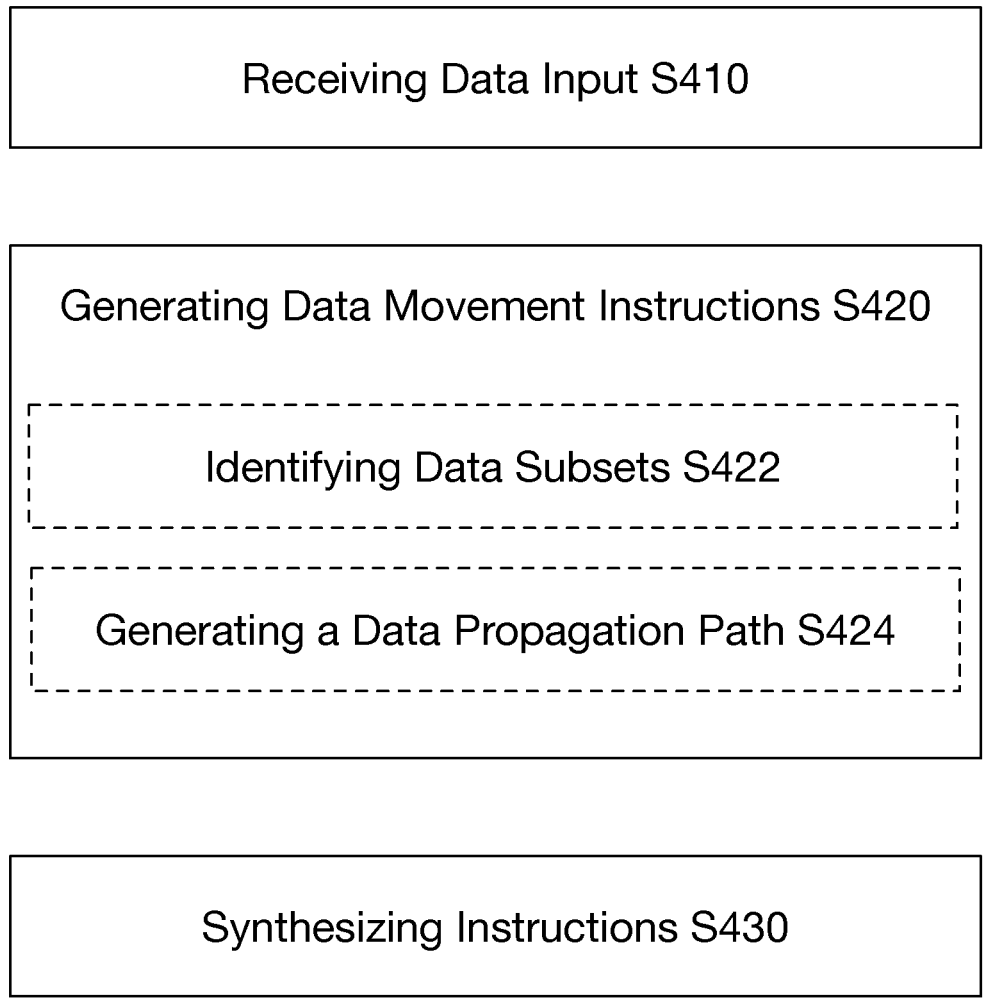
FIG. 4 illustrates a method 400 for implementing data control in accordance with one or more embodiments of the present application.

As shown in FIG. 4, a method 400 for controlling a movement of data within an integrated circuit includes receiving data input S410, generating data movement instructions S420, and synthesizing (and/or tethering) instructions S430. The generating data movement instructions S420 may additionally or optionally include identifying disparate data subsets S422 and generating a data propagation path for each of the identified disparate data subsets S424.

The method 400 preferably functions to optimize a propagation of data within an integrated circuit which enables a continuity of data flow that improves a processing efficiency of the integrated circuit by reducing data duplication in memory and reducing clock cycles required for obtaining and processing data. Specifically, the method 400 enables the generation of a predetermined data flow schedule that includes broad and/or coarse data propagation paths for a plurality of subsets of data as well as specific and/or granular data propagation paths for each of the plurality of subsets of data throughout an integrated circuit.

Additionally, the method 400 preferably generates instructions to move data input in a predetermined manner throughout the storage (memory) and processing elements of an integrated circuit and may further, integrate the data movement instructions with computation and/or execution instructions. This, in turn, functions to eliminate requests for data and issuing addresses to memory for specific data that is required for completing a computation instruction and/or an execution instruction. That is, in a traditional integrated circuit or the like, data required for processing is typically pulled into the circuit using addresses to memory by the circuit or device that requires the data. However, the method 400 may function to push data into an integrated circuit for storing and processing by circuits and/or devices of the integrated circuit thereby reducing a number of clock cycles typically associated with memory addressing from data processing circuits and improving the processing speed and performance of the integrated circuit.

S410, which includes receiving input data, functions to receive and/or collect input data for processing from one or more input data sources. The input data may be any type or kind of data. For instance, the input data may include data capture by one or more external sensors that may be placed in operable communication with a system (e.g., integrated circuit 100) implementing the method 400. The data collected at the one or more sensors may include image data, acoustic data, thermal data, microwave data, and the like. It shall be noted that data collected at the one or more sensors may include any suitable data that is detectable (e.g., via the one or more sensors) and that may be captured by the one or more sensors, the data may include any data relating to the surroundings and/or circumstances surrounding a system implementing the method 400 and/or the data may include data collected from disparate or connected systems (e.g., another system connected via a network (mesh network or the like)) that may be provided via a communication network to a machine implementing the method 400, and/or the data may include internal/external operational data of a machine implementing the method 400.

In some implementations of S410, the data provided as input into an integrated circuit or system implementing the method 400 includes system-derived data that is generated as a result of a prior processing of raw data (e.g., raw sensor data) or potentially a prior processing of previously processed data. For instance, in a multi-tiered or multi-layered system that includes multiple tiers or layers of processing circuitry, raw data processed at a first processing layer of the multi-level system may be provided as input into a subsequent processing layer that may function to implement the method 400. Accordingly, the data collected at S410 may be sourced from a prior or upstream processing layer of a single integrated system or the like.

In some implementations of S410, the data provided as input into an integrated circuit or system implementing the method 400 includes system-derived data generated by an upstream device. The upstream device may be an on-chip device or circuit that is in operable communication with the primary processing circuits (e.g., the integrated circuit array 105). Additionally, or alternatively, the upstream device may be an off-chip device or circuit that provides data to on-chip devices or circuits that may be in operable communication the primary processing circuits of a system implementing the method 400. In either case, the off-chip and/or the on-chip device or circuit may function to perform one or more pre-processing or storage functions of the data prior to transmitting the data to the primary processing circuits for processing.

S420, which includes generating data movement instructions, functions to generate instructions that govern a manner in which the received and/or the collected data propagates preferably within a system implementing the method 400. Specifically, S420 may include generating data movement instructions that include a predetermined data flow schedule that coarsely and granularly defines a movement of distinct subsets of data throughout an integrated circuit. In a preferred embodiment, S420 may be performed by an instructions generator 170 and/or a dispatcher circuit (e.g., dispatcher 130) that may function to generate a collection of instructions that include computation instructions (e.g., add x+y, etc.), execution instructions (e.g., read, write, store, etc.), data movement instructions, and/or any suitable instructions for processing data within a system implementing the method 400.

Preferably, the data movement instructions generated by a dispatcher or an instructions generator may be integrated with other instructions into a single composition instruction set. In this combined state or format, the data movement instructions and the other instructions may be received by one or more circuits and/or nodes in an integrated circuit (or system) as a singular instruction packet thereby allowing some or all of the instructions within the instructions packet to be performed in parallel.

In a preferred embodiment, S420 may function to generate data movement instructions for the received and/or the collected data in parallel (simultaneously) with the generation of other computational and/or executional instructions. In such embodiment, S420 may function to implement a single module or multiple, disparate modules (at the dispatcher) that enable the generation of the data movement instructions as well as the computational and/or execution instructions at the same time. Additionally, or alternatively, S420 may function to generate data movement instructions along with computational and/or executional instructions in any suitable order including in a sequential order, a prioritized order, and the like.

Preferably, S420 may function to generate data movement instructions for a dataset based on one or more of attributes (e.g., data size, a number of data layers, data dependencies, and/or the like) of the dataset and one or more attributes of the integrated circuit array of an integrated circuit executing the method 400.

Additionally, or alternatively, S420 includes identifying disparate data subsets from the received and/or collected input dataset S422. In a preferred embodiment, S422 may function to identify the disparate data subsets based on a configuration and/or an arrangement of an integrated circuit array of a system implementing the method 400. The integrated circuit array (e.g., integrated circuit array 105) preferably includes a plurality of border cores (e.g., border cores 120) and a plurality of array cores (array cores no) arranged in a predetermined or fixed manner. Accordingly, S422 may function to partition or segment the received or the collected input data into disparate data subsets to fit or optimize an arrangement of the data subsets based on a capacity of the predetermined arrangement or the predetermined configuration of the integrated circuit array. For instance, in the case that the received input data comprises image data, S422 may function to fit all pixels of the image data to the predetermined configuration of the integrated circuit array by partitioning the image data into disparate data subsets (i.e., subsets of pixel data of an entire image) where each of the disparate data subsets may be loaded (or allocated) onto the integrated circuit array such that each disparate data subset occupies a disparate array core or border core within the integrated circuit array.

Additionally, or alternatively, S420 may function to partition or segment an input dataset into subsets based on a configuration of the array cores of an integrated circuit array. In such embodiments, S420 may function to partition an input dataset to a size that matches or that is lower than a capacity of a computational and/or processing element of a respective array core. For instance, an array core may include a plurality of MAC computing elements with a predetermined capacity to receive and compute against data of a specific size. In such example, S420 may function to create, from a larger dataset, a plurality of smaller or subsets of data having a size that matches the capacity or is smaller than a capacity of a respective MAC of an array core.

Additionally, for each identified data subset, S420 may function to identify a propagation path S424. Preferably, the propagation path for each data subset identifies at least a starting position of a specific data subset and a terminal position of the specific data subset. Additionally, or alternatively, the propagation path may include intermediary travel positions of the data subset that occur between the starting position and the terminal position. Accordingly, S424 may function to assign an initial (starting) position of the data subset within an integrated circuit array. In a preferred embodiment, most or all data subsets may be assigned an initial position within the integrated circuit array at a border core. In one or more preferred embodiments, a plurality of border cores may form the periphery of an integrated circuit array. In such embodiments, data scheduled for processing may be loaded into an integrated circuit array by first loading the data at the border cores that form the outer periphery of the integrated circuit array.

It shall be noted, however, that while in some embodiments the data subsets may be injected into the integrated circuit array at a peripheral border core (e.g., a potential starting and/or ending position of a data propagation), the data subsets in additional or alternative embodiments may be injected directly into any array core or border core of an integrated circuit array. Specifically, in some embodiments, data subsets may bypass peripheral cores of an integrated circuit array via one or more data buses connected to a data loading mechanism (e.g., periphery controllers or the like) and one or more cores in an interior of an integrated circuit array.

Figure 5:
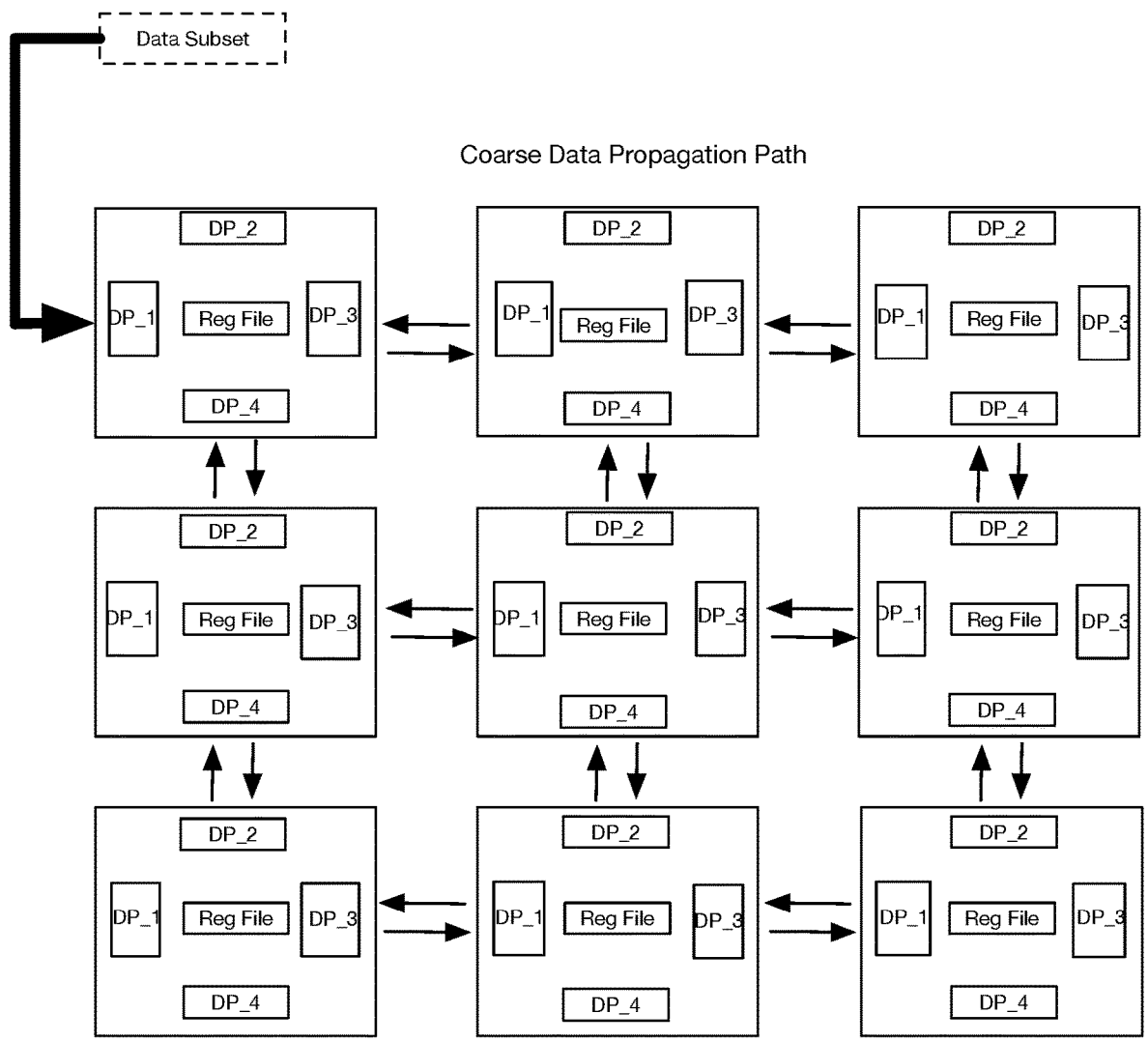
FIG. 5 illustrates a schematic of a coarse data propagation path within a section of an integrated circuit array in accordance with one or more embodiments of the present application.

Accordingly, S424 may function to generate a coarse propagation path for each of the identified data subsets which indicate a general propagation path along the integrated circuit as identified by the two or more nodes (i.e., border and/or array cores) that an identified data subset may traverse prior to, during, and/or post processing, as shown by way of example in FIG. 5. In some embodiments, the coarse propagation path may be referred to herein as or include inter-core data movements defining a travel path or routing of the data subset between cores of the integrated circuit array 105 or the like.

Figure 6:
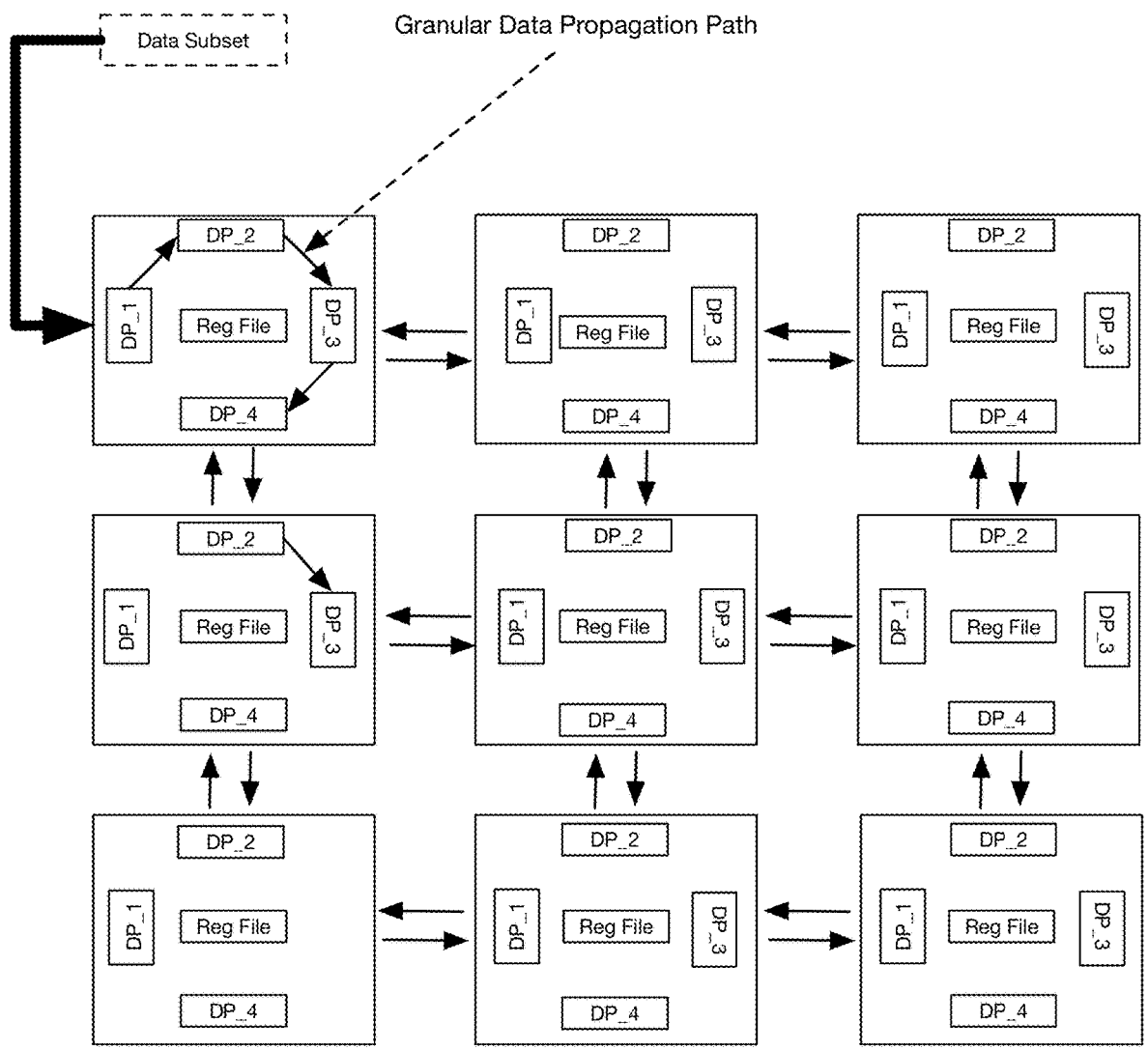
FIG. 6 illustrates a schematic of a granular data propagation path within a section of an integrated circuit array in accordance with one or more embodiments of the present application.

S424 may additionally or alternatively generate a granular propagation path that precisely identifies one or more movements of an identified data subset within a border core and/or within an array core, as shown by way of example in FIG. 6. Generally, the granular propagation path provides data movement instructions that enables the data subset to physically traverse between cores of an integrated circuit array by identifying a sequence of internal (incoming/outgoing) data ports and/or processing elements (e.g., MACs) of the cores through which the data subset should travel. In a preferred embodiment, the granular propagation path for an identified data subset may include a sequence of intra-core data movements that define a movement of a data subset [i] between one or more register files of a core and the internal data ports of the core and [ii] movements of the data subset between disparate internal data ports and/or processing elements of a core. Additionally, or alternatively, the granular propagation path for an identified data subset may include a sequence of intra-core movements of the data subset between an internal data port of at a least a first core and an internal data port of a second core. The granular propagation path may additionally define movements of the data subset between an internal data port of a core and a port of a periphery controller or the like and movements between ports and/or register files of a core and data buses arranged within the integrated circuit. Accordingly, the granular propagation path may include instructions for entrance into one or more processing elements of a core as well as an exit out of the one or more processing elements of the core.

In one implementation, S424 may function to generate a granular propagation path defining a sequence of data movements comprising one or more data rotation instructions that, when executed, causes a data subset to move in a rotational manner from a first data port of a core to a disparate data port of the same core. Additionally, or alternatively, the sequence of data movements may be between processing elements (e.g., MACs) and/or data ports of a core. Accordingly, a data rotation as referred to herein preferably relates to moving data within a core (e.g., a border core, an array core, etc.) in a rotational manner based on rotational instructions. The rotational instructions are preferably defined as a degree of rotation between zero and three hundred sixty (0 to 360) (and/or −360 to 0) measured from an initial position (i.e., data port position within a core) of a data subset.

As further shown in FIG. 6, a core may include at least four data ports that may function to store incoming and/or outgoing data subsets. Each data port may include one or more incoming register files that may function to receive and store data subsets incoming from a disparate core, register file, or data port and one or more outgoing register files that may function to store and transmit data subsets outgoing to a disparate core, register file, or data port. In one example, S424 may function to generate a granular propagation path including data rotation instructions that enables a data subset to traverse a 3×3 filter for processing a subset of an image by rotating between data ports of border cores until the data subset arrives within a data port of an array core that may function to process the data subset. In this example, S424 may function to generate an optimized data rotation sequence that transports the data subset from the border core to an array core for processing in the most efficient path. As a first example of data rotation instructions, S424 may generate the data rotation instructions [R270-border core_1, R90-border core_4]; executing R270-border core_1 would cause the data subset to rotate 270 degrees from data port_1 of border core_1 to an outgoing register file of data port_4 of border core_1 at which point the data subset is transferred from border core_1 to an incoming register file of data port_2 of border core_4. Executing R90-border core_4 would cause the data subset to rotate 90 degrees from data port_2 of border core_4 to data port_3 of border core_4 at which point the data subset is transferred from border core_4 to an incoming register file of data port_1 of the array core.

It shall be noted that, while in some embodiments the data may be rotated via direct transmissions between data ports of a core, data may also be transmitted in a linear fashion between cores using an intermediary such as a central or main (large) register file of a core. For instance, a data subset at a first data port of a core may be collected and transmitted by a central register file of the core to a second data port of the core.

Further, while it is generally shown that a core may have four data ports located at sides of the core, it shall be noted that a core may have more than four data ports that can be located at its corners or located in such a manner that a core may transmit or collect data from its diagonal neighbors in addition to its lateral neighbors.

Additionally, or alternatively, S424 may function to generate data rotation instructions for a dataset that may be executed on a per clock cycle basis. That is, each data rotation instruction of a sequence of data rotation instructions for a data subset may require a single clock cycle. For instance, the data rotation instructions including the sequence [(1) R270-border core_1, (2) R90-border core_4] may require at least two clock cycles to execute the two data movement instructions. It shall be noted that, while in the above-described example that each disparate data rotation instruction may be executed per clock cycle, multiple data rotation instructions may be executed per clock cycle for a single data subset.

In a second implementation, S424 may function to generate a granular data propagation path based on identifying a series of data movements based on data port identification values. In such implementation, each data port of a core may be assigned a data port identification value. The data movement instructions of a granular data propagation path may be defined by a series of data port identification values, such as for example: [(1) south port-border core_1, (2) east port-border core_4]. In this example, a data subset may move from a first data port of border core_1 to the south port and then from a first port of border core_4 to an east port. The port identification values may be any type of value and/or combination of characters and/or symbols.

S430, which includes synthesizing instructions, functions to generate and/or compose a single set of instructions that includes a combination of data movement instructions together with one or more of computation instructions and execution instructions. S430 may function to synthesize data movement instructions with computation and/or execution instructions in any suitable manner that enables the different type of instructions included in the composition to be executed in parallel, in series, and/or in a combination of in series and in parallel.

Accordingly, S430 may function to tether the single composition instruction set to a specific data subset such that the data subset and the single composition instruction set move jointly throughout an integrated circuit array. Alternatively, S430 may function to load the single composition instruction set into an integrated circuit array separately from an associated data subset.

S440, which includes executing the data movement instructions, may function to enable an execution of data movement instructions for a given dataset and/or each of a plurality of distinct data subsets derived from the given dataset. The execution of the data movement instructions may include an execution of the instructions by one or more of a plurality of periphery controllers.

Accordingly, in some embodiments, the execution of the data movement instructions in S440 may additionally function to trigger an automatic flow of data within an integrated circuit executing the method 400 according to the predetermined data flow schedule. In such embodiments, once an execution of the data movement instructions is performed, an input dataset may flow throughout an integrated circuit in a raw or unprocessed state to completed or processed state at an end of the predetermined data flow schedule.

The systems and methods of the preferred embodiment and variations thereof can be embodied and/or implemented at least in part as a machine configured to receive a computer-readable medium storing computer-readable instructions. The instructions are preferably executed by computer-executable components preferably integrated with the system and one or more portions of the processor and/or the controller. The computer-readable medium can be stored on any suitable computer-readable media such as RAMs, ROMs, flash memory, EEPROMs, optical devices (CD or DVD), hard drives, floppy drives, or any suitable device. The computer-executable component is preferably a general or application specific processor, but any suitable dedicated hardware or hardware/firmware combination device can alternatively or additionally execute the instructions.

Although omitted for conciseness, the preferred embodiments include every combination and permutation of the implementations of the systems and methods described herein.

As a person skilled in the art will recognize from the previous detailed description and from the figures and claims, modifications and changes can be made to the preferred embodiments of the invention without departing from the scope of this invention defined in the following claims.

What is claimed is:

1. A method of controlling a movement of data within an integrated circuit, the method comprising:
   providing an integrated circuit array comprising:
      a plurality of border cores, each border core of the plurality of border cores comprises a data storage device;
      a plurality of processing cores, each processing core of the plurality of processing cores includes:
         (i) a plurality of distinct input/output (I/O) data ports, wherein at least some of the plurality of distinct I/O data ports are located at sides of the core;
         (ii) a plurality of distinct data processing circuits arranged within the processing core;
   identifying an input dataset;
   executing a coarse data propagation path for each of a plurality of distinct subsets of data of the input dataset, wherein executing the coarse data propagation path includes:
      executing a predetermined sequence of inter-core movements, for each of the plurality of distinct subsets of data entering the integrated circuit array, that moves a respective distinct subset of data of the plurality of distinct subsets of data from an assigned starting position at one of the plurality of border cores to an assigned terminal position at one of the plurality of distinct processing cores for processing the respective distinct subset of data;
      executing a predetermined sequence of intra-core movements, for each of the plurality of distinct subsets of data entering the terminal position at the one of the plurality of distinct processing cores, that moves the respective distinct subset of data in the predetermined sequence within the one distinct processing core by moving the respective distinct subset of data in a degree of rotation between zero and three hundred sixty from an initial I/O data port at one of the sides of the one distinct processing core directly to one or more I/O data ports at distinct sides of the one distinct processing core until the predetermined sequence of intra-core movements is fully executed; and
   enabling a predetermined flow of the input dataset within the integrated circuit array based on a combination of the coarse data propagation path and the granular propagation path.

2. The method according to claim 1, wherein:
   each of the coarse data propagation path and the granular data propagation path are defined based on a predetermined data flow schedule that governs a propagation of data between a hierarchical memory structure of the integrated circuit and the integrated circuit array of the integrated circuit.

3. The method according to claim 2, wherein: the integrated circuit array includes:
   the plurality of processing cores are distinct from the plurality of border cores.

4. The method according to claim 2, wherein
   the hierarchical memory structure enables direct memory access between a main memory and the integrated circuit array, the hierarchical memory structure includes:
      a plurality of dual FIFOs that each interface with the integrated circuit array and transmits and accepts data on a first-in, first-out basis,
      a plurality of periphery load stores that each interface with a respective dual FIFO of the plurality of dual FIFOs and store one or more loads of data that is either received from the respective dual FIFO and/or that is pending a loading into the respective dual FIFO, and
      a plurality of periphery memory that each interface with a respective periphery load store of the plurality of periphery load stores and interfaces with the main memory.

5. The method according to claim 1, further comprising:
   generating data movement instructions based on attributes of the input dataset and an architecture of the integrated circuit array,
   wherein the data movement instructions define the coarse data propagation path and the granular data propagation path for each of the plurality of distinct data subsets of the input dataset.

6. The method according to claim 5, further comprising: generating data computation instructions and/or execution instructions; and generating a single set of instructions that includes a combination of data movement instructions together with one or more of data computation instructions and execution instructions.

7. The method according to claim 5, wherein
generating data movement instructions includes:
   identifying, from the input dataset, each of the plurality of distinct subsets of data based on a predefined configuration of the integrated circuit array, wherein identifying each of the plurality of distinct subsets of data includes:
      partitioning the input dataset into the plurality of distinct subsets of data to fit the predefined configuration of the integrated circuit array.

8. The method according to claim 5, further comprising:
associating, with each of the plurality of distinct subsets of data of the input dataset, a given coarse data propagation path; and
   associating, with each of the plurality of distinct subsets of data of the input dataset, a given granular data propagation path.

9. The method according to claim 1, wherein
the granular data propagation path for each of the plurality of distinct subsets of data defines intermediary travel positions that occur between the starting position and the terminal position.

10. The method according to claim 1, wherein
the one or more data rotation instructions include one or more discrete rotation values defined as a specific degree of rotation value between zero degrees and three hundred sixty degrees and/or between zero degrees and negative three hundred sixty degrees measured from an initial position of the given subset of data within the core.

11. The method according to claim 10, wherein
each data movement of a sequence of data movements for a given subset of data requires only a single clock cycle to execute.

12. The method according to claim 1, wherein
the coarse data propagation path and the granular data propagation path for each of the plurality of distinct subsets of data are performed without issuing memory address by the plurality of cores.

13. The method according to claim 1, wherein
the plurality of processing cores further comprise a plurality of distinct I/O data ports located at corners of each respective processing core, wherein the plurality of distinct I/O data ports store data from and transmit data to given processing cores diagonally positioned from each other.

14. The method according to claim 1, wherein
at least one of the plurality of distinct data processing circuits is located at each side of a respective processing core.

15. The method according to claim 14, wherein
executing the predetermined sequence of intra-core movements further moves the respective distinct subset of data in the predetermined sequence within the one distinct processing core by moving the respective distinct subset of data in a degree of rotation between zero and three hundred sixty from an initial processing circuit at one of the sides of the one distinct processing core directly to one or more processing circuits at distinct sides of the one distinct processing core until the predetermined sequence of intra-core movements is fully executed.

16. A method of propagating data within an integrated circuit, the method comprising:
   providing an integrated circuit array comprising:
      a plurality of border cores, each border core of the plurality of border cores comprises at least one register file;
      a plurality of processing cores, each processing core of the plurality of processing cores include:
         (i) a plurality of distinct input/output (I/O) data ports, wherein at least some of the plurality of distinct I/O data ports are located at sides of the core; and
         (ii) a plurality of distinct data processing circuits arranged within the processing core;
   obtaining an input dataset;
   implementing a coarse data propagation path for each of a plurality of distinct subsets of data of the input dataset, wherein implementing the coarse data propagation path includes:
      implementing a predetermined sequence of inter-core movements, for each of the plurality of distinct subsets of data entering the integrated circuit array, that moves a respective distinct subset of data of the plurality of distinct subsets of data from an assigned starting position at one of the plurality of border cores to an assigned terminal position at one of the plurality of distinct processing cores for processing the respective distinct subset of data;
      implementing a predetermined sequence of intra-core movements, for each of the plurality of distinct subsets of data entering the terminal position at the one of the plurality of distinct processing cores, that moves the respective distinct subset of data in the predetermined sequence within the one distinct processing core by moving the respective distinct subset of data in a degree of rotation between zero and three hundred sixty from an initial I/O data port at one of the sides of the one distinct processing core directly to one or more I/O data ports at distinct sides of the one distinct processing core until the predetermined sequence of intra-core movements is fully executed;
   executing a flow of the input dataset within the integrated circuit array based on a combination of the coarse data propagation path and the granular propagation path.

17. The method according to claim 16, wherein:
each of the coarse data propagation path and the granular data propagation path are defined based on a predetermined data flow schedule that governs a propagation of data between a hierarchical memory structure of the integrated circuit and the plurality of distinct data processing circuits of the integrated circuit.

18. The method according to claim 16, wherein:
the plurality of processing cores are distinct from the plurality of border cores.

19. The method according to claim 18, wherein
the hierarchical memory structure enables direct memory access between a main memory and the integrated circuit array, the hierarchical memory structure includes:
   a plurality of dual FIFOs that each interface with the integrated circuit array and transmits and accepts data on a first-in, first-out basis,
   a plurality of periphery load stores that each interface with a respective dual FIFO of the plurality of dual FIFOs and store one or more loads of data that is either received from the respective dual FIFO and/or that is pending a loading into the respective dual FIFO, and a plurality of periphery memory that each interface with a respective periphery load store of the plurality of periphery load stores and interfaces with the main memory.

20. A method of controlling a movement of data within an integrated circuit, the method comprising:
providing an integrated circuit array comprising:
a plurality of border cores, each border core of the plurality of border cores comprises a data storage device and a plurality of input/output (I/O) data ports, wherein at least some of the plurality of distinct I/O data ports are located at sides of the core;
a plurality of processing cores, each processing core of the plurality of processing cores includes:
(i) a plurality of distinct input/output (I/O) data ports, wherein
at least some of the plurality of distinct I/O data ports are located at sides of the core;
(ii) a plurality of distinct data processing circuits arranged within the processing core;
identifying an input dataset;
executing a coarse data propagation path for each of a plurality of distinct subsets of data of the input dataset, wherein executing the coarse data propagation path includes:
executing a predetermined sequence of inter-core movements, for each of the plurality of distinct subsets of data entering the integrated circuit array, that moves a respective distinct subset of data of the plurality of distinct subsets of data between distinct cores of the integrated circuit array;
executing a predetermined sequence of intra-core movements, for each of the plurality of distinct subsets of data entering one of the plurality of distinct processing cores or one of the plurality of distinct border cores, that moves the respective distinct subset of data in the predetermined sequence within the one distinct processing core or the one distinct border core by moving the respective distinct subset of data in a degree of rotation between zero and three hundred sixty lfrom an initial I/O data port at one of the sides of the one distinct processing core or the one distinct border core directly to one or more I/O data ports at distinct sides of the one distinct processing core or of the one distinct border core until the degree of rotation between zero and three hundred sixty is fully executed; and
enabling a predetermined flow of the input dataset within the integrated circuit array based on a combination of the coarse data propagation path and the granular propagation path.

* * * * *